(12) United States Patent
Stranczl et al.

(10) Patent No.: US 9,778,620 B2
(45) Date of Patent: Oct. 3, 2017

(54) METHOD FOR CREATING A FLEXIBLE, MULTISTABLE ELEMENT

(71) Applicant: Nivarox-FAR S.A., Le Locle (CH)

(72) Inventors: Marc Stranczl, Nyon (CH); Thierry Hessler, St-Aubin (CH)

(73) Assignee: NIVAROX-FAR S.A., Le Locle (CH)

(*) Notice: Subject to any disclaimer, the term of this patent is extended or adjusted under 35 U.S.C. 154(b) by 403 days.

(21) Appl. No.: 14/423,900

(22) PCT Filed: Nov. 6, 2013

(86) PCT No.: PCT/EP2013/073116
§ 371 (c)(1),
(2) Date: Feb. 25, 2015

(87) PCT Pub. No.: WO2014/072317
PCT Pub. Date: May 15, 2014

(65) Prior Publication Data
US 2015/0203985 A1 Jul. 23, 2015

(30) Foreign Application Priority Data

Nov. 9, 2012 (EP) .................................... 12192026

(51) Int. Cl.
*G04B 15/14* (2006.01)
*G04B 17/26* (2006.01)
(Continued)

(52) U.S. Cl.
CPC ................ *G04B 15/14* (2013.01); *C30B 1/10* (2013.01); *C30B 29/18* (2013.01); *G04B 15/12* (2013.01); *G04B 17/26* (2013.01)

(58) Field of Classification Search
CPC combination set(s) only.
See application file for complete search history.

(56) References Cited

U.S. PATENT DOCUMENTS

2005/0206243 A1 9/2005 Bouche
2010/0214880 A1 8/2010 Rappo et al.
(Continued)

FOREIGN PATENT DOCUMENTS

EP 1 562 207 8/2005
EP 1 666 990 6/2006
(Continued)

OTHER PUBLICATIONS

International Search Report Issued May 8, 2014 in PCT/EP13/073116 Filed Nov. 6, 2013.

*Primary Examiner* — Duy Deo
*Assistant Examiner* — Erin Bergner
(74) *Attorney, Agent, or Firm* — Oblon, McClelland, Maier & Neustadt, L.L.P.

(57) ABSTRACT

Method for creating a flexible, multistable element (5):
a silicon component (S) is etched with a beam (P) connecting two ends (E1, E2) of a rigid mass (MU) having a cross-section more than ten times that of said beam (P),
$SiO_2$ is grown at 1100° C. for a duration adjusted to obtain, on said beam (P), a first ratio (RA) of more than 1 between the section of a first peripheral layer (CP1) of $SiO_2$, and that of a first silicon core (A1), and, on said mass (MU), a second ratio (RB) between the section of a second peripheral layer (CP2) of $SiO_2$ and that of a second silicon core (A2), which is less than a hundredth of said first ratio (RA);
cooling to ambient temperature is performed, to deform said beam (P) by buckling when said mass (MU) cools and contracts more than said beam (P).

18 Claims, 6 Drawing Sheets

(51) Int. Cl.
    *G04B 15/12*     (2006.01)
    *C30B 1/10*     (2006.01)
    *C30B 29/18*     (2006.01)

(56) References Cited

U.S. PATENT DOCUMENTS

2012/0008468 A1    1/2012  Bossart et al.
2013/0029157 A1*  1/2013  Karapatis ............ B81C 1/00682
                                                                                              428/446

FOREIGN PATENT DOCUMENTS

| EP | 1 801 668 | 6/2007 |
| EP | 2 037 335 | 3/2009 |
| EP | 2 407 831 | 1/2012 |
| EP | 2 450 756 | 5/2012 |
| WO | 2007 000271 | 1/2007 |

* cited by examiner

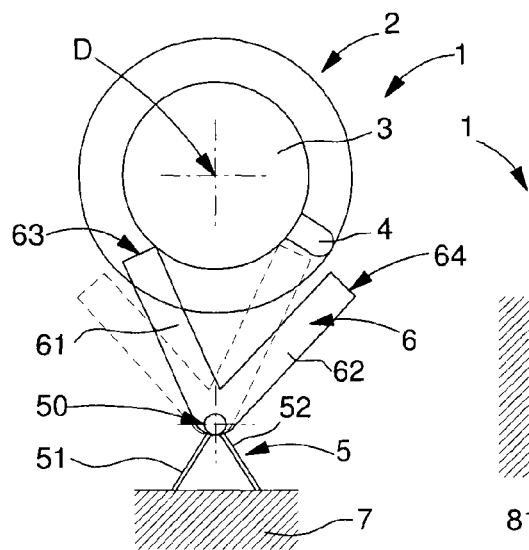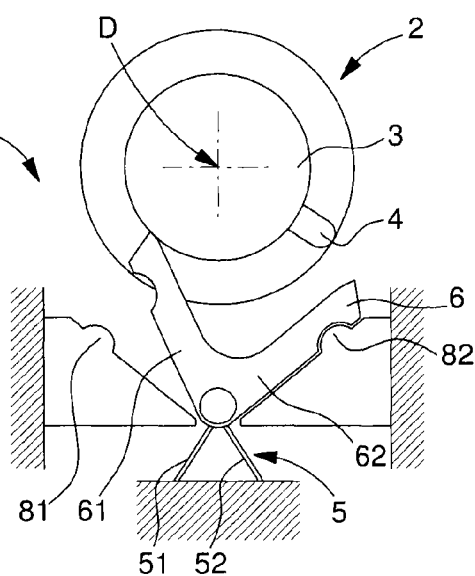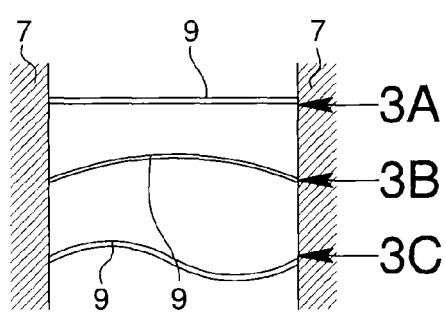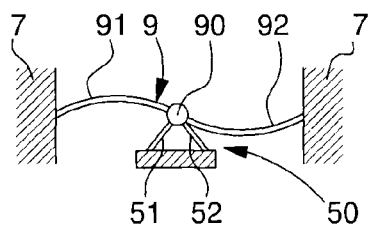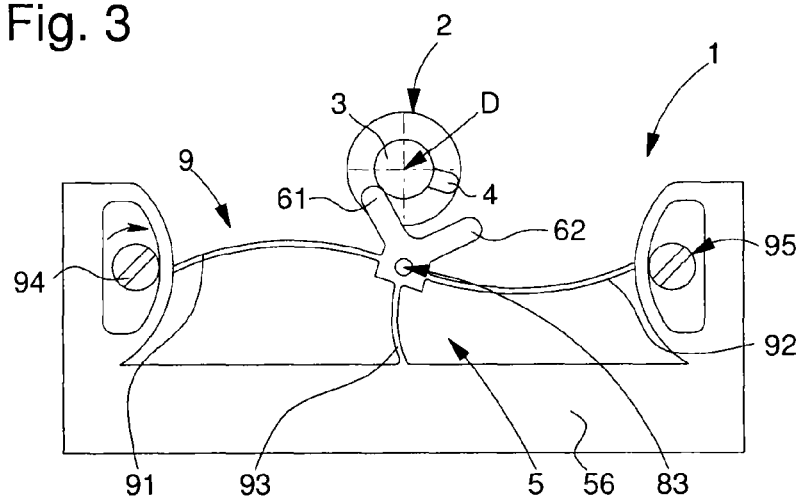

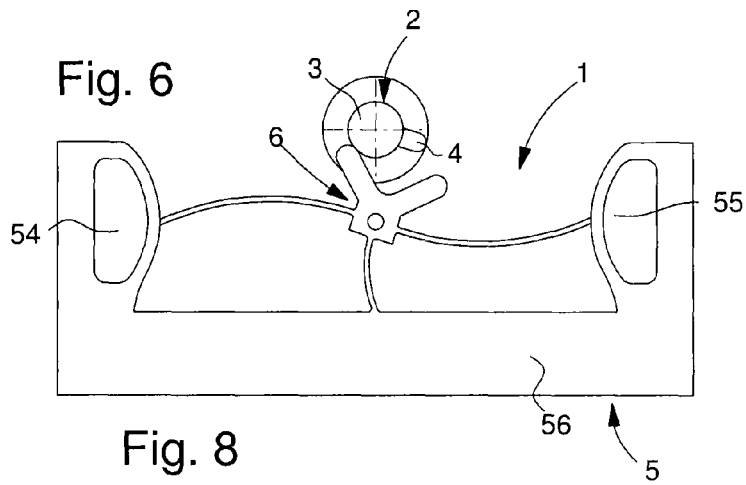
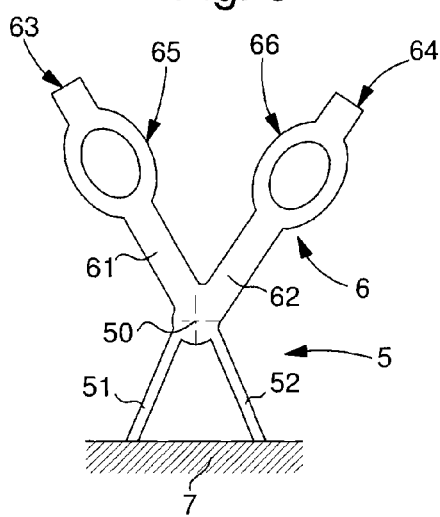
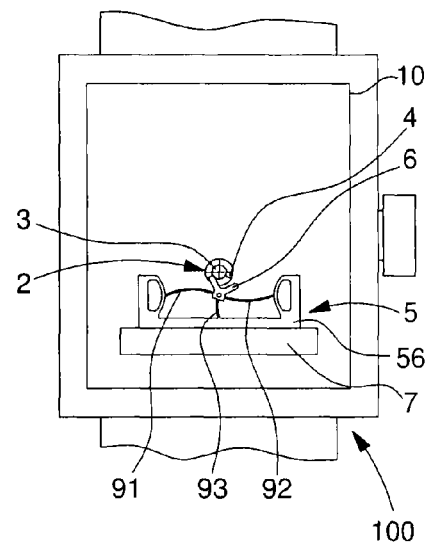
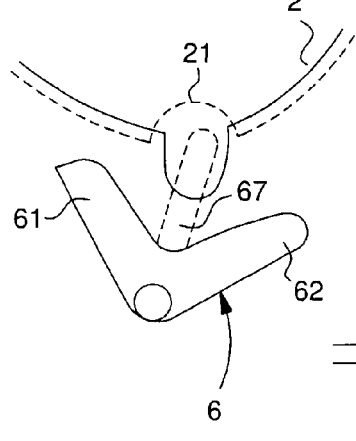
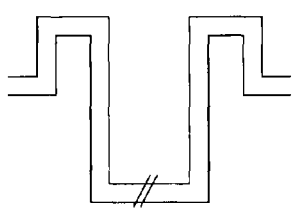
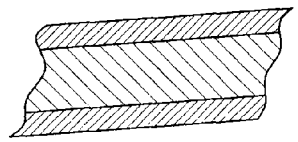

Fig. 6A
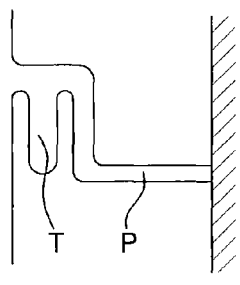
↓ +SiO₂
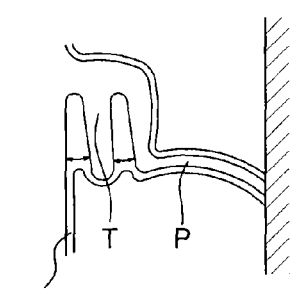
Fig. 6B
Fig. 7
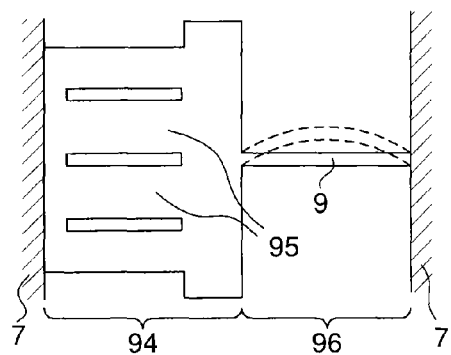
Fig. 7A
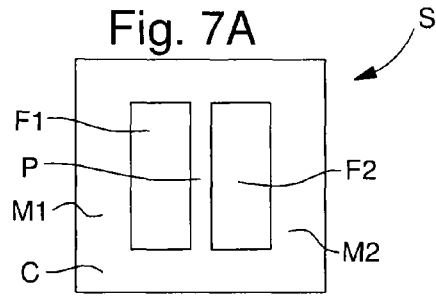
Fig. 7B
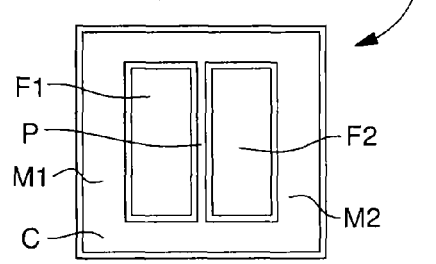
Fig. 7C
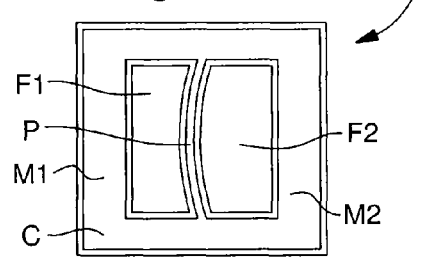
Fig. 10
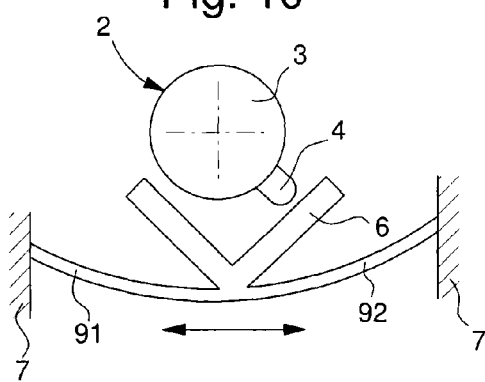

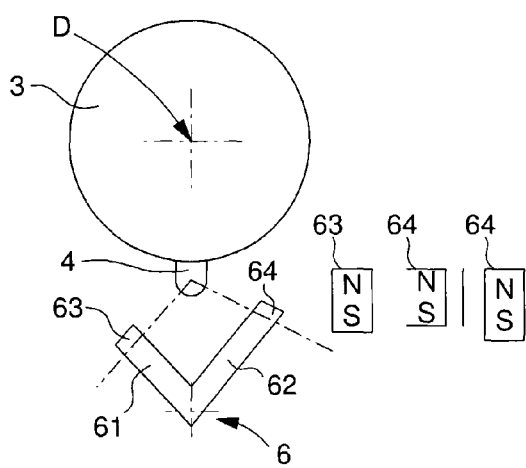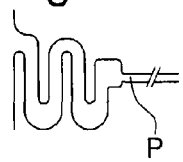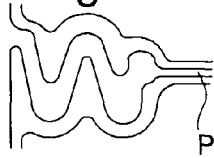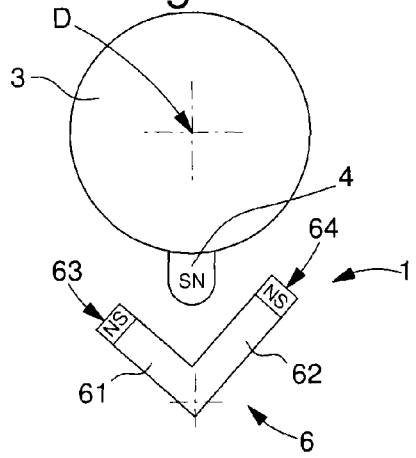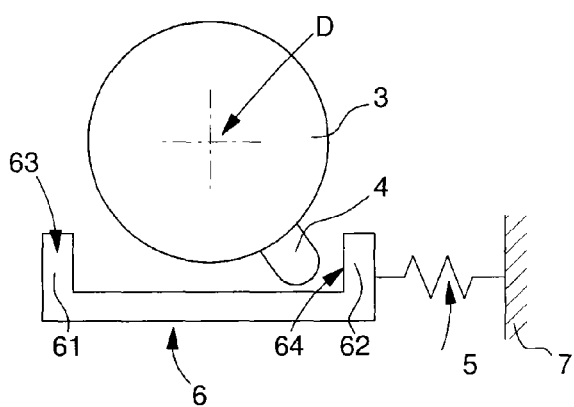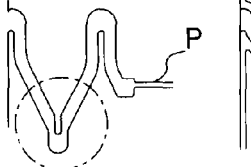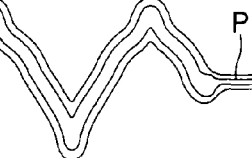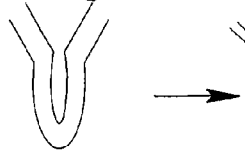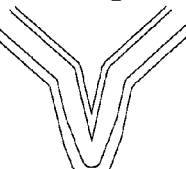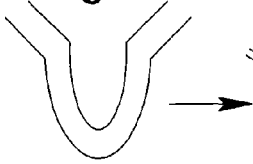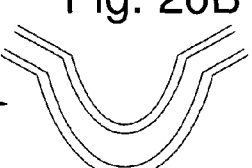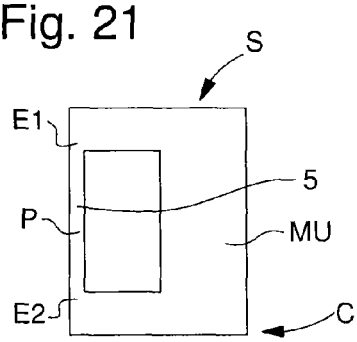

METHOD FOR CREATING A FLEXIBLE, MULTISTABLE ELEMENT

FIELD OF THE INVENTION

The invention concerns two methods for creating a flexible, bistable strip.

The invention concerns the field of timepiece mechanisms, particularly escapement mechanisms.

BACKGROUND OF THE INVENTION

Improving rate and the search for improved efficiency are constant preoccupations of mechanical watch designers, who seek to obtain the greatest possible power reserve, combined with regularity, precision and security in the most difficult conditions of use. The regulating assembly, and the escape mechanism are at the heart of this problem.

In particular, in mechanical watches, escapements have to satisfy several safety criteria. One of the safety devices, the anti-trip mechanism, is designed to prevent the angular extension of the balance going beyond a normal angle of rotation.

EP Patent No 1801668 B1 in the name of Montres Breguet SA proposes a mechanism whose structure is characterized in that it includes a pinion mounted on the balance staff. This pinion meshes with a toothed wheel, at least one spoke of which abuts against a fixed stop if the balance is driven beyond its normal angle of rotation. However, this mechanism affects the inertia of the balance and may disturb its oscillations. Further, there is friction in the gear forming the mechanism which also disturbs the regulating mechanism.

EP Patent Application No 1 666990 A2 in the name of Montres Breguet SA discloses another anti-trip mechanism based on the expansion of the balance spring: a locking arm, fixed to the outer coil of the balance spring, is inserted between a finger integral with the balance and two columns integral with the balance bar. Locking only occurs in the event of excessive expansion of the balance spring beyond an angle exceeding its normal operating angle. This mechanism only limits the angle of rotation in one direction of rotation.

EP Patent Application No 2450756 A1 in the name of Nivarox discloses an anti-trip device for an escapement mechanism, with a pivoting wheel set carrying a finger which moves in a cam path integral with the balance. This pivoting wheel set may include an arm with a bistable lever, particularly an elastic bistable lever.

EP Patent Application No 2037335 A2 in the name of Enzler-Von-Gunten discloses a pallet lever which has two arms provided with pallet stones, and a pallet fork, the assembly being formed in a single piece with two flexible securing arms, which define a virtual pivot axis of the pallet lever, and allow the pallet lever to pivot when they bend, the median axes of these two strips intersecting on the virtual axis.

WO Patent No 2007/000271 in the name of ETA discloses a reinforced micromechanical part with a silicon core coated with a thick amorphous material, particularly silicon dioxide in a layer having a thickness of more than 50 nm.

EP Patent Application No 2407831A1 in the name of Rolex, discloses a silicon or quartz balance spring with cutouts alternating with bridges, over the entire length of at least one coil. In particular a silicon core is coated with a layer of amorphous silicon dioxide.

EP Patent Application No 1 562207A1 in the name of St Microelectronics SA discloses a method for creating a flexible, multistable element, in this case a membrane, including steps of depositing silicon nitride layers which have internal compression stresses giving the membrane bistability after cooling.

In short, known safety mechanisms each have at least one of the following recurrent drawbacks: disruption of oscillations by modifying the inertia of the regulating member, adversely affecting efficiency under the effect of friction, or limiting the angle of rotation in only one direction of rotation.

SUMMARY OF THE INVENTION

It is an object of the present invention to improve the efficiency of a watch and to overcome the aforementioned problems, with very little disruption of the oscillations of the balance, with negligible or zero loss of efficiency, and by limiting the angular travel of the balance in both directions of rotation.

The invention also concerns a method for creating a flexible, multistable element, wherein:
- a silicon component is etched with a beam connecting two ends of a rigid mass having a cross-section more than ten times that of said beam,
- $SiO_2$ is grown at 1100° C. for a duration adjusted to obtain, on said beam, a first ratio of more than 1 between the cross-section of a first peripheral layer of $SiO_2$, and that of a first silicon core, and, on said mass, a second ratio between the cross-section of a second peripheral layer of $SiO_2$ and that of a second silicon core, which is less than a hundredth of said first ratio;
- cooling to ambient temperature is performed, to deform said beam by buckling when said mass cools and contracts more than said beam.

In particular, a first method for creating a flexible, multistable strip is achieved by the following series of operations:
- a silicon component S is etched in which a slender beam P of small cross-section forms the connection between two ends of at least one mass of large cross-section, at least ten times greater than said small cross-section, said at least one mass forming a rigid frame;
- said component is subjected, in a furnace, to a known silicon dioxide $SiO_2$ growth method by maintaining a temperature of 1100° C. for several hours;
- this duration is adjusted by several hours so as to obtain, on said beam, a first silicon core covered with a first peripheral layer, and on said mass, a second silicon core covered with a second peripheral layer, and so that a first ratio between, on the one hand, the section of said first peripheral layer of said beam formed of silicon dioxide $SiO_2$, and on the other hand, the section of said first core of said beam formed of silicon is higher than 1,
- and so that a second ratio between, on the one hand, the section of said second peripheral layer of said mass formed of silicon dioxide $SiO_2$, and on the other hand, the section of said second core of said mass formed of silicon, is less than a hundredth of said first ratio;
- cooling is performed to ambient temperature, around 20° C., so as to deform beam P by buckling during cooling of said at least one mass, whose contraction during cooling is greater than the contraction of said beam.

The invention also concerns another method for creating a flexible, multistable strip by the following series of steps:

a silicon component is etched in which a slender beam of small cross-section forms the connection between at least two masses, each of large cross-section, at least ten times greater than said small cross-section, said two masses forming together or with other structural elements a rigid frame;

said component is subjected, in a furnace, to a known silicon dioxide $SiO_2$ growth method by maintaining a temperature of 1100° C. for several hours;

this duration is adjusted by several hours so as to obtain, on said beam, a first silicon core covered with a first peripheral layer, and on each said mass, a second silicon core covered with a second peripheral layer, and so that a first ratio between, on the one hand, the section of said first peripheral layer of said beam formed of silicon dioxide $SiO_2$, and on the other hand, the section of said first core of said beam formed of silicon is higher than 1, and so that a second ratio between, on the one hand, the section of each of said second peripheral layers of said masses formed of silicon dioxide $SiO_2$, and on the other hand, the section of said second core of said second masses formed of silicon, is less than a hundredth of said first ratio;

cooling is performed to ambient temperature, around 20° C., so as to deform said beam by buckling during cooling of said two masses, whose contraction during cooling is greater than the contraction of said beam.

BRIEF DESCRIPTION OF THE DRAWINGS

Other features and advantages of the invention will appear upon reading the following detailed description, with reference to the annexed drawings, in which:

FIG. 1 shows a schematic front view of a timepiece limiter or transmission mechanism according to the invention, made in the form of an anti-trip mechanism according to the invention, fixed to a structure of a movement and cooperating alternately via one of several arms comprised therein, two in this illustration, with a pin of a balance.

FIG. 2 shows a similar view to FIG. 1 of the same mechanism supplemented by a shock absorber mechanism.

FIG. 3 shows a schematic view of three states of an embedded beam: at rest in 3A, in a first buckling mode in 3B, and in a second buckling mode in 3C.

FIG. 4 shows a schematic front view of an embedded, prestressed beam, buckled in the second mode of FIG. 3A under the action of a flexible pivot.

FIG. 5 shows a schematic front view of an embodiment of the invention according to the principle of FIG. 4, with the beam buckled and prestressed by off-centre screws, and in a single piece embodiment.

FIG. 6 illustrates a variant of FIG. 5 wherein the prestress is achieved by pockets of silicon oxide in a silicon frame. FIGS. 6A and 6B illustrate, before and after the silicon is oxidised, a detail of an area with large differences in cross-section, and greatly modified after the silicon dioxide is formed, and subjecting a straight beam of smaller cross-section to a buckling stress.

FIG. 7 illustrates another prestressing principle using the buckling resistance differential between a network of parallel, oxidised silicon beams and a single prestressed buckled beam. FIGS. 7A, 7B, 7C illustrate successive steps of a method for oxidising and buckling a beam.

FIG. 8 illustrates a variant with anti-trip stop arms including flexible shock absorbing areas.

FIG. 9 shows a partial, schematic view of a timepiece in the form of a watch including a movement with an anti-trip device according to the invention.

FIG. 10 illustrates a configuration in which a virtual bistable pivot of the anti-trip mechanism is moveable in translation.

FIG. 11 illustrates a detail of an anti-trip mechanism including at least two levels for holding the arms of the anti-strip system in the plane of the balance pin: a first, upper level with arms cooperating with said pin, and a second, lower level with a guard pin cooperating with a notch of the balance.

FIG. 12 is a structure that can be deformed by silicon oxidation, in a variant of the FIG. 7A structure.

FIG. 13 shows the cross-section of a single crystal quartz structure for creating an anti-trip mechanism according to a method similar to that of the invention.

FIG. 14 illustrates a mechanism of the invention, having a repulsion function, between the balance pin and the arms of the anti-trip mechanism, performed by magnets located in a vertical orientation, and with a cross-section along the dotted line.

FIG. 15 illustrates a similar embodiment, oriented in the plane of the magnetic field.

FIG. 16 is a schematic view, similar to FIG. 10, of a more general case where the movement may be of any type and is bistable.

FIGS. 17A and 17B illustrate prestressing obtained by the encounter of oxide growths (before and after) in a coil.

FIGS. 18A and 18B (and the details thereof in FIGS. 19A and 19B) show prestressing obtained by opening the apex angles of a zig-zag profile during silicon oxide growth (before and after).

FIGS. 20A and 20B illustrate a variation in the angle obtained by varying (before and after) the radius of curvature of the oxidised walls in an area with a very low radius of curvature.

FIG. 21 is a schematic view of a flexible bistable strip cooperating with both ends of a single mass.

DETAILED DESCRIPTION OF PREFERRED EMBODIMENTS

The invention concerns a method via which a flexible, multistable strip is created, particularly a bistable strip, for a timepiece mechanism.

Figure 22:
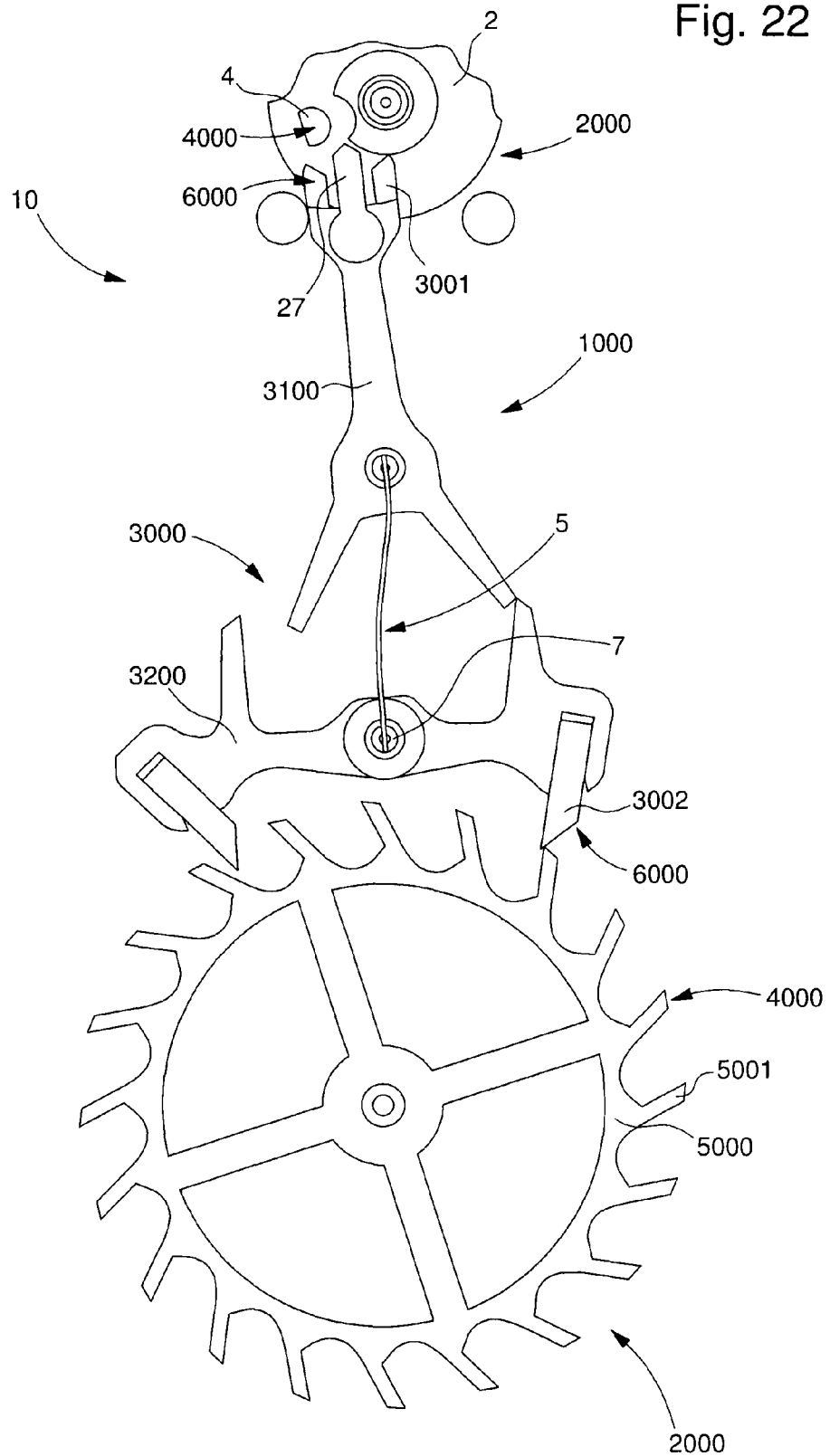
FIG. 22 illustrates a plan view of another application wherein the timepiece limiter or transmission mechanism is a pallet lever mechanism between a balance and an escape wheel.
Figure 23A:
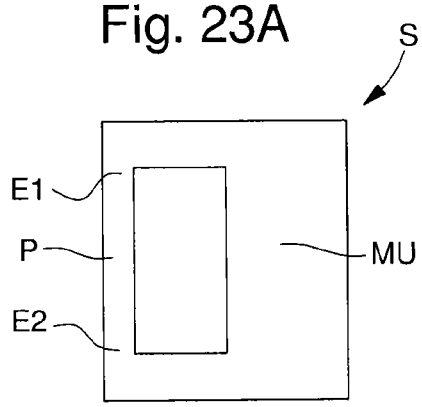
FIGS. 23 and 24 illustrate, in a similar manner to FIG. 7 in three successive images, before treatment, during heating to form silicon dioxide, and after cooling to ambient temperature, 23A, 23B, 23C and 24A, 24B, 24C, methods for manufacturing a flexible, multistable element with a beam of small cross-section between two ends, respectively of the same mass of large cross-section, and two separate masses also of large cross-section.
Figure 23B:
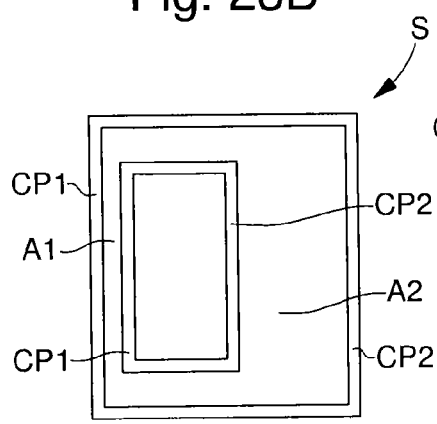
Figure 23C:
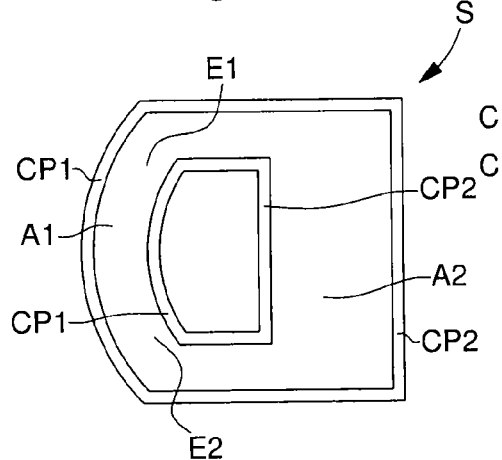

In a first variant, illustrated in FIGS. 21 and 23A, 23B, 23C, a flexible, bistable strip 5 cooperates with both ends E1, E2 of at least one mass, and in particular of a single mass MU. The method then includes the following series of operations:

a silicon component S is etched in which a slender beam P of small section forms the connection between two ends E1, E2 of at least one mass MU of large cross-section (at least ten times greater than said small cross-section), said at least one mass MU forming a rigid frame C;

this component S is subjected, in a furnace, to a known silicon dioxide $SiO_2$ growth method by maintaining a temperature of 1100° C. for several hours;

this duration of several hours is adjusted so as to obtain, on said beam P, a first silicon core A1 covered with a first peripheral layer CP1, and on said mass MU, a second silicon core A2 covered with a second peripheral layer CP2, and so that a first ratio RA between, on the one hand, the section of said first peripheral layer CP1 of said beam P formed of silicon dioxide $SiO_2$, and on the other hand, the section of said first core A1 of said beam P formed of silicon is higher than 1, and so that a second ratio RB between, on the one hand, the section of said second peripheral layer CP2 of said mass MU formed of silicon dioxide $SiO_2$, and on the other hand, the cross-section of said second core A2 of said mass MU formed of silicon, is less than a hundredth of said first ratio RA, cooling is performed to ambient temperature, around 20° C., so as to deform beam P by buckling during cooling of said at least one mass MU, whose contraction during cooling is greater than the contraction of said beam P.

Figure 24A:
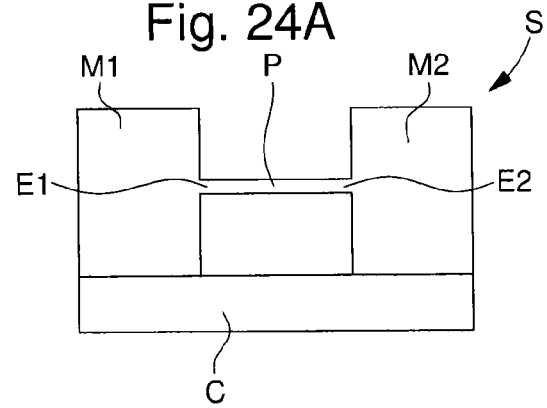
Figure 24B:
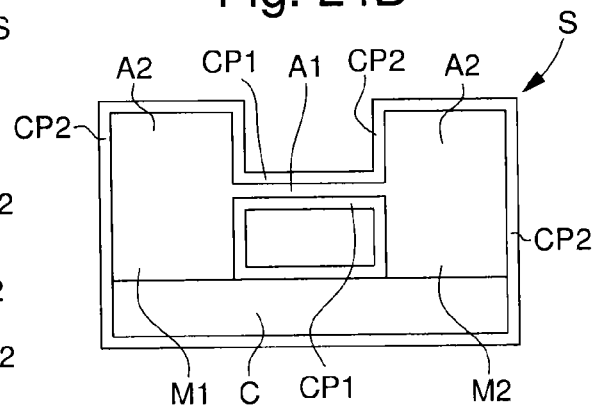
Figure 24C:
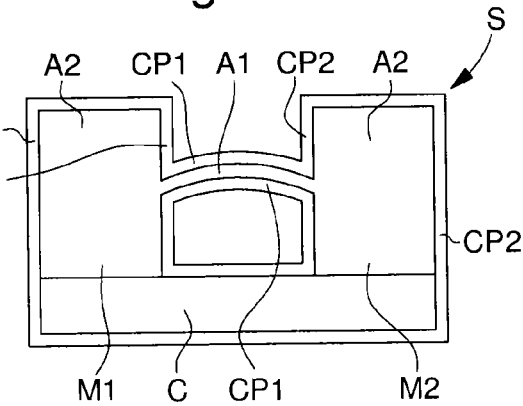

FIGS. 7A, 7B, 7C and 24A, 24B, 24C illustrate a second variant implementation of a method for creating a flexible, bistable strip, involving at least two masses. This method includes the following series of operations:

a silicon component S is etched in which a slender beam P of small cross-section forms the connection between at least two masses M1, M2 each of large cross-section, at least ten times greater than the small cross-section, said two masses M1, M2 forming together or with other structural elements a rigid frame C;

this component S is subjected, in a furnace, to a known silicon dioxide SiO2 growth method by maintaining a temperature of 1100° C. for several hours;

this duration of several hours is adjusted so as to obtain, on said beam P, a first silicon core A1 covered with a first peripheral layer CP1, and on each said mass M1; M2, a second silicon core A2 covered with a second peripheral layer CP2, and so that a first ratio RA between, on the one hand, the section of said first peripheral layer CP1 of said beam P formed of silicon dioxide $SiO_2$, and on the other hand, the section of said first core A1 of said beam P formed of silicon is higher than 1, and so that a second ratio RB between, on the one hand, the section of each of said second peripheral layers CP2 of said masses M1; M2 formed of silicon dioxide $SiO_2$, and on the other hand, the section of each of said second cores A2 of said second masses M1; M2 formed of silicon, is less than a hundredth of said first ratio RA;

cooling is performed to the ambient temperature, around 20° C., so as to cause beam P to buckle during the cooling of the two masses M1 and M2, whose contraction during cooling is greater than the contraction of beam P.

In a close variant of the invention, the structure of anti-trip mechanism 1 is made of single crystal quartz. As shown in FIG. 13, the top and bottom surfaces of the central single crystal quartz core are coated with a deposition made at a higher temperature than the ambient temperature, with a coefficient α lower than the coefficient $α_{x,y}$ of quartz. This quartz coefficient $α_{x,y}$ is 7.5 ppm/° C.

In an advantageous application, this method for producing a flexible, multistable element is applied to a timepiece limiter or transmission mechanism 1000 for limiting or transmitting the angular travel of a wheel set 2000 of a timepiece movement 10, said wheel set 2000 including at least one projecting pin or tooth 4000, particularly a radially projecting tooth 5001 or axially projecting pin 4. According to the invention, this timepiece limiter or transmission mechanism 1000 includes limiting or transmission means 6000 which are fixed, via at least one flexible, multistable, particularly bistable element 5, to another component of movement 10 or to a rigid structural element 7 of movement 10.

In a particular application, this timepiece limiter or transmission mechanism 1000 is an anti-trip mechanism 1, which is intended to prevent a timepiece balance 2 racing. The balance includes a staff 3 and a pin 4 or a similar element projecting from said staff 3.

According to the invention, anti-trip mechanism 1 includes at least one single-piece, flexible, bistable element, which will be designated hereinafter "flexible bistable element 5" carrying at least one anti-trip stop member 6 and which is fixed, via flexible and elastic connecting elements, to a rigid structural element 7, such as a bottom plate, bar or similar of a timepiece movement 10 in which there is integrated a regulating member including balance 2.

In a particular variant, this structure 7 contains a system of self-alignment with the staff of balance 2.

This flexible, bistable element 5 carries at least one anti-trip stop member 6, one end 63 or 64 of which can, according to the angular position of balance 2, interfere with the trajectory of pin 4, and perform the function of a stop member if balance 2 exceeds its normal angular travel.

FIG. 1 sets out a flow diagram, in a particular, preferred but non-limiting application, wherein flexible bistable element 5 and the at least one anti-trip stop member 6 together form a monolithic component. In this non-limiting example, anti-trip stop member 6 includes two arms 61, 62, whose respective ends 63, 64 may each, according to the position of balance 2, interfere with the trajectory of pin 4, and perform the function of a stop member if balance 2 exceeds its normal angular travel. This embodiment with two arms, as illustrated, limits the angle of rotation of balance 2 in both directions of rotation of said balance. FIG. 1 shows, in dotted lines, a position of interference with balance 2, limiting the angular travel thereof.

Flexible bistable element 5 is illustrated here with these flexible and elastic connecting elements which are formed by at least two thin strips 51, 52, each fixed at a first end to structure 7 and connected via a second end to the body of the flexible element. In the particular case of FIG. 1, the two thin strips 51, 52 are connected via the second ends thereof to the body of the flexible element in a "V" shape, so as to define a virtual pivot 50 about which anti-trip stop member 6 can pivot. Thus, in the case of FIGS. 1 and 2, flexible bistable element 5 according to the invention is a flexible bistable pivot. This embodiment is not exclusive, FIG. 10 is a diagram of the case where anti-trip stop member 6 is moveable in translation. FIG. 16 illustrates a more general case where the movement may be of any type and is bistable.

Preferably, at least two flexible arms 51, 91, 52, 92 are mounted prestressed and buckled relative to structure 7 or relative to a frame 56 comprised in flexible bistable element 5.

Each of strips 51, 52 may occupy several states, according to the stresses to which they are subjected. Each of these strips is calculated to work by buckling, and may adopt several geometries, according to its buckling mode, as seen in FIG. 3: at rest in 3A, in a first buckling mode, with a concave or convex shape in 3B, in a second buckling mode with an S or Z shape in 3C. Flexible bistable element 5 may include flexible elements whose shapes are different to the flexible strips 51, 52, illustrated here, without departing from the invention.

Flexible bistable element 5 may also, in a particular embodiment, be made in a single piece with structural element 7.

In a particular embodiment, illustrated in FIG. 8, flexible elements 65, 66 may be included in arms 61, 62 of stop member 6 of anti-trip mechanism 1 to prevent excessive shocks.

This flexible bistable element 5 may be made in silicon technology, "LIGA", MEMS or similar. It has very low inertia compared to that of balance 2, and the actuation thereof only slightly disrupts the oscillations of balance 2.

FIG. 2 illustrates a shock absorber mechanism for protecting flexible strips 51 and 52 of flexible bistable element 5. This mechanism is useful, or even necessary, in cases where anti-trip stop members 6 have to limit the amplitude of balance 2. The purpose is to absorb shocks in shock absorber stop members 81, 82, which cooperate in abutment with arms 61, 62 and not to transmit these shocks to flexible arms 51, 52 to avoid breaking said arms. FIG. 5 shows a shock absorber stop member 83 coaxial with the flexible pivot. In this example embodiment, the shock absorber stop members 81 and 82 include substantially cylindrical protuberances, which cooperate with grooves of substantially complementary shape in arms 61 and 62.

Flexible bistable pivot 5 may be made in accordance with several principles. FIG. 3 introduces the principle of a bistable state considered in this particular case. Use is made of the natural buckling modes of a beam 9 subjected to a stress, more particularly the second mode illustrated in FIG. 3C.

As shown in FIG. 4, in an advantageous embodiment, in order to force beam 9 to buckle in the second mode, a pivot 90 forces beam 9 to have a node at the middle thereof (centre of rotation of the added pivot). The centre of rotation 50 of bistable pivot 5 is then the centre of rotation of the added pivot 90.

FIG. 5 shows a complete anti-trip mechanism 1 made in accordance with this principle. Flexible bistable pivot 5 includes at least one prestressed beam 9 buckled in the second mode where beam 9 adopts an S or Z shape, a pivot 90 forcing said beam 9 to have a node in the median area, preferably in the middle thereof. Preferably in the case of FIG. 5, flexible bistable pivot 5 is made by buckling two prestressed beams 91 and 92 (which together form beam 9) by stressing them here using two off-centre screws 94 and 95. A third beam 93 fixed to structure 7 or to a frame 56 of flexible bistable element 5, forces beam 9, formed of beams 91 and 92, to deform in the second mode, and plays the part of pivot 90 of FIG. 4. Shock absorber stop member 83 is located in the centre of rotation 50 of flexible bistable pivot 5.

FIG. 11 illustrates an anti-trip stop member 6 including at least two levels for holding arms 61, 62 of the anti-trip system in the plane of balance pin 4: a first upper level with arms 61 and 62 cooperating with pin 4 and a second lower level with a guard pin 67 cooperating with a notch 21 of balance 2.

To remove any contacts or decrease any contact pressure, anti-trip mechanism 1 according to the invention may also advantageously include means for creating a repulsion force or torque between balance 2 and arms 61, 62 of anti-trip mechanism 1.

FIG. 14 illustrates the case where this repulsion function is performed by magnets located in a vertical orientation, on pin 4 and ends 63, 64 of arms 61, 62. FIG. 15 illustrates a similar embodiment, with orientation in the plane of the magnetic field; the north and south poles of these magnets are shown.

In a similar location, in place of magnets, or in addition thereto, electrets may be used (electrostatic charges) to exert these repulsion forces.

This is to increase the efficiency of anti-trip mechanism 1 and to disturb as little a possible the operation of balance 2. The operation of anti-trip mechanism 1 is as follows:
  when tipping, in a first phase, balance 2 delivers energy to flexible bistable element 5;
  once past the point of equilibrium, in a second phase, the mechanism returns part of the energy to balance 2 making a small impulse.

The mechanism operates in a similar manner to the horns of a Swiss lever; there is a release and then an impulse.

In a particular embodiment, balance 2 and/or at least arms 61, 62 of anti-trip stop member 6, or the entire anti-trip mechanism 1 when it is in a single piece, in an advantageous embodiment, is made in silicon technology from a silicon wafer, with or without silicon oxide growth, and with a surface layer containing, according to the case, either magnets or magnetic particles on the one hand, or electrets on the other hand. This particular layer may be achieved by a galvanic method, or by cathodic sputtering, or by another suitable micro-technical structuring method.

In the preferred case where flexible bistable element 5 is produced in silicon technology, the creation of stresses in the strips forming beams 91 and 92 may occur via silicon oxidisation. Indeed, silicon oxide takes up a larger volume when it is grown from silicon, as seen in FIG. 6, where pockets 54, 55 of SiO2 Are created in a silicon frame 56. The example of FIG. 5 or 6 shows that this frame 56 may also form structure 7, or be connected thereto in a very simple manner by any ordinary mechanical securing technology.

FIGS. 6A and 6B illustrate, before and after silicon oxidation, a detail of an area having large differences in cross-section, which is greatly modified after silicon dioxide has formed, subjecting to a buckling stress a straight beam P of smaller cross-section than a head. T of which the beam forms an extension.

Another means of achieving buckling stresses in these strips is by oxidation of a silicon structure of particular shape, as shown in FIG. 7. Silicon oxidation creates surface stresses which have the effect of increasing the length of an oxidised beam. FIG. 7 illustrates another prestressing principle using the buckling resistance differential between a network of parallel oxidised silicon beams and a single prestressed buckled beam, and shows a simple mechanism wherein, in the left part, a parallel structure 94 has a set of parallel beams 95 which, after oxidation (in dotted lines), will force to buckle and bend, in the right part, a flexible element to be stressed 96, in this case a beam 9, 91, 92 or similar, which is required to be deformed, the buckling resistance of parallel structure 94 being much greater than that of the flexible element to be stressed 96. FIGS. 7A, 7B, 7C illustrate successive steps of a method for oxidising and buckling a beam P arranged between two apertures F1, F2 in a frame C. FIG. 7A shows the basic structure resulting from silicon etch shaping, at the moment when it is placed in a furnace. FIG. 7B illustrates the development of silicon oxide $SiO_2$ inside apertures F1 and F2 and thus on the sides of beam P, by keeping the structure at 1100° C. for several hours; in a known manner, the growth of silicon dioxide $SiO_2$ occurs via the partial consumption of silicon towards the exterior of the component, and consequently in thin beam P, the proportion of silicon dioxide $SiO_2$ increases when the proportion of silicon decreases, over time during this treatment at 1100° C. FIG. 7C shows the contraction of the structure after cooling to ambient temperature, around 20° C. The lateral members M1, M2 of frame C, parallel to beam P, which are essentially formed of silicon and a little silicon dioxide, contract more than beam P, which is then essentially formed of silicon dioxide which has a lower expansion coefficient than silicon. Consequently, beam P is subjected to a buckling stress and takes a bistable state.

Another variant is illustrated in FIG. 12.

FIGS. 17A and 17B also illustrate the prestress obtained by the encounter of oxide growths in a coil.

FIGS. 18A and 18B (and the details thereof in FIGS. 19A and 19B) show prestressing obtained by opening the apex angles of a zig-zag profile in accordance with the same principle: the growth of silicon oxide forces these angles to open, and the movement is amplified by the Z or zig-zag geometry of the structure. FIGS. 20A and 20B show the angle variation obtained by varying the radius of curvature of the oxidised walls in an area having a very low radius of curvature.

The anti-trip mechanism 1 illustrated here limits the direction of rotation of the balance in both directions of rotation. It only very slightly disturbs the oscillations of balance 2.

The invention may be used in watch mechanisms which do not have an anti-trip mechanism.

In another particular application, this timepiece limiter or transmission mechanism 1000 is a pallet lever mechanism 3000 for an escape mechanism, in particular, but not restrictively, a Swiss lever, with the same principle, for cooperation with a balance 2 and with an escape wheel 5000. This pallet lever 3000 includes at least one flexible multistable, notably bistable, element 5. The lever may be made in a flexible lever embodiment having constant force in accordance with EP Patent Application No 12183559.9 of the same Applicant. The cooperation of this pallet lever 3000 with balance 2 is achieved by horns 3001 similar to the ends 63, 64 of arms 61 and 62 of the anti-trip stop member 6 described above. These horns 3001, carried by a first portion 3100 of pallet lever 3000, are connected by at least one flexible, multistable notably bistable strip 5, either to a fixed structure 7, or preferably to a second portion 3200 of the pallet lever including pallet stones 3002 cooperating with the teeth 5001 of escape wheel 5000. Likewise, these pallet stones 3002 are advantageously formed in a similar manner to arms 61 and 62, and are connected by at least one flexible, multistable, notably bistable strip 5, either to a fixed structure 7, or preferably to first portion 3100 of the pallet lever including horns 3001.

In a particularly advantageous manner, to improve rate and efficiency, the interaction between horns 3001 and balance 2 on the one hand, and/or pallet stones 3002 and escape wheel 5000 on the other hand, is achieved with no contact or with attenuated contact, and, for this purpose, the affected surfaces of horns 3001 and/or pallet stones 3002 are magnetised or electrified to cooperate in repulsion with opposing surfaces of the balance and/or respectively of the escape wheel, which are made of suitable material and/or are advantageously magnetised or respectively electrized in a complementary manner. Patent Application No PCT/EP2011/057578 in the name of the Swatch Group Research and Development Ltd discloses this type of contactless or attenuated contact transmission, the combination of which with a mechanism having a flexible, multistable strip, particularly a pallet lever, provides the required advantages.

The invention further concerns a timepiece movement 10 including at least one regulating member having a balance 2, and which includes at least one timepiece limiter or transmission mechanism 1000 according to the invention. According to the case, movement 10 includes a structure 7 to which there is fixed a flexible, bistable element 5 of said timepiece limiter or transmission mechanism 1000 or said flexible, bistable element 5 actually forms this structure.

The invention also concerns a timepiece 100, in particular a watch, including at least one movement 10 of this type, or at least one timepiece limiter or transmission mechanism 1000 of this type.

Equivalent mechanisms based on conventional pivots and springs corresponding to the flexible bistable pivots are considered to form part of the present invention.

The technologies used to make the device are not limited to silicon technology but also include "LIGA", MEMS and other micro-manufacturing methods.

The invention claimed is:

1. A method for creating a flexible, multistable strip comprising:

making a single-piece silicon component blank including at least one flexible beam to form a flexible, multistable strip between two ends, and at least one rigid mass of greater mass than a mass of any of said flexible beam and having a larger cross-section at every point than a cross-section of any of said flexible beam, and any of said rigid mass to form a more rigid structure than any of said flexible, multistable strip, and so that at least one of said flexible beam having an initial curvilinear length extends between a first of said rigid mass at a first said end and a second of said rigid mass at a second said end, said first and second ends being formed by a boundary of an area of smallest cross-section of said flexible beam with an area of largest cross-section of said rigid mass, and being separated by an initial distance less than or equal to said initial curvilinear length, and said first rigid mass and said second rigid mass forming together a rigid frame which is also a rigid mass;

subjecting said component, in a furnace, to a silicon dioxide $SiO_2$ growth process by maintaining a temperature of 1100° C. for several hours;

adjusting a duration of said several hours so as to obtain a cross-section of silicon dioxide $SiO_2$ which is greater on any of said rigid mass than that on any of said flexible beam; and cooling is performed to ambient temperature, around 20° C., so as to deform by buckling at least said flexible beam having the initial curvilinear length during cooling of said first rigid mass and of said second rigid mass whose contraction during cooling is greater than contraction of said flexible beam, so that a final distance between said first and second ends is strictly less than a final curvilinear length of said flexible beam having the initial curvilinear length, and so that said final curvilinear length is more than or equal to said initial curvilinear length.

2. The method according to claim 1, wherein said duration of the silicon dioxide $SiO_2$ growth phase is adjusted so that a ratio between the cross-section of silicon dioxide $SiO_2$ and the cross-section of silicon is higher in any of said flexible strip than in any of said rigid mass.

3. A method for creating a flexible, multistable strip comprising:
etching a silicon component in which a slender beam of small cross-section forms a connection between two ends of at least one mass of large cross-section, at least ten times greater than said small cross-section, said at least one mass forming a rigid frame;
subjecting said component, in a furnace, to a silicon dioxide $SiO_2$ growth process by maintaining a temperature of 1100° C. for several hours;
adjusting a duration of said several hours so as to obtain, on said beam, a first silicon core covered with a first peripheral layer, and on said mass, a second silicon core covered with a second peripheral layer, and so that a first ratio between a cross-section of said first peripheral layer of said beam formed of silicon dioxide $SiO_2$ and a cross-section of said first core of said beam formed of silicon is higher than 1, and so that a second ratio between a cross-section of said second peripheral layer of said mass formed of silicon dioxide $SiO_2$ and a cross-section of said second core of said mass formed of silicon is less than a hundredth of said first ratio,
cooling is performed to ambient temperature, around 20° C., so as to deform said beam by buckling during cooling of said at least one mass, whose contraction during cooling is greater than the contraction of said beam.

4. A method for creating a flexible, multistable strip comprising:
etching a silicon component in which a slender beam of small cross-section forms a connection between at least two masses each of large cross-section, at least ten times greater than said small cross-section, said two masses forming together or with other structural elements a rigid frame;
subjecting said component, in a furnace, to a silicon dioxide $SiO_2$ growth process by maintaining a temperature of 1100° C. for several hours;
adjusting a duration of said several hours so as to obtain, on said beam, a first silicon core covered with a first peripheral layer, and on each said mass, a second silicon core covered with a second peripheral layer, and so that a first ratio between a cross-section of said first peripheral layer of said beam formed of silicon dioxide $SiO_2$ and a cross-section of said first core of said beam formed of silicon is higher than 1, and so that a second ratio between a cross-section of each of said second peripheral layers of said masses formed of silicon dioxide $SiO_2$ and a cross-section of each of said second cores of said second masses formed of silicon is less than a hundredth of said first ratio,
cooling is performed to ambient temperature, around 20° C., so as to deform said beam by buckling during cooling of said two masses, whose contraction during cooling is greater than contraction of said beam.

5. The method for manufacturing a flexible, multistable element according to claim 3, wherein said flexible, multistable element is created including a structure that is a deformation resistant structure and having a first stiffness, and made in a single-piece with said structure, flexible, elastic connecting elements having a second stiffness less than one tenth of said first stiffness, said connecting elements being formed by at least two thin strips each fixed at a first end to said structure and connected by a second end to a body of said flexible, multistable element and forming together a V shape whose apex, on said body, defines a virtual pivot about which said body can pivot.

6. The method according to claim 5, wherein the at least two of said thin strips are mounted prestressed and buckled in relation to said structure.

7. The method according to claim 5, wherein said beam is formed in a shape of a straight beam with two segments mounted buckled in a first mode where said straight beam adopts a C-shaped profile, or in a second mode where said straight beam adopts an S or Z shape, and substantially aligned on either side of a central point arranged to cooperate with a pivot forcing said straight beam to have a node at the central point and to be buckled according to said second mode.

8. The method according to claim 5, wherein said beam is formed in a shape of a straight beam with two segments, and said flexible, multistable element is formed with a third beam fixed to said structure to force said straight beam formed of said segments to deform in a second mode where said straight beam adopts an S or Z shape.

9. The method according to claim 7, wherein stresses are created in the strips forming said segments by silicon oxidation around pouches of $SiO_2$ which are created in said structure.

10. The method according to claim 1, wherein said flexible, multistable element is made with at least one area having large differences in cross-section, and whose geometry is greatly modified with formation of silicon dioxide, and subjecting to buckling stress the flexible beam or a straight beam of smaller cross-section than an edge or a head of which said flexible beam forms an extension.

11. The method according to claim 5, wherein said flexible, multistable element is prestressed using a buckling resistance differential between a network of parallel silicon oxide beams and a single beam connected at a first end to said structure and at a second end to said network, and said single beam is subjected to buckling prestress after oxidation of said network, a buckling resistance of said network being much greater than that of said single beam.

12. The method according to claim 1, wherein the flexible beam, arranged between two apertures of the frame, is subjected to oxidation and buckling, by growth of silicon dioxide $SiO_2$ inside said apertures and on sides of said flexible beam, and after contraction of the structure following cooling to ambient temperature, by contraction of side posts of said frame each forming a said rigid mass, parallel to said flexible beam, which contract more than said flexible beam, which is then essentially formed of silicon dioxide which has a lower expansion coefficient than silicon, and which is consequently subjected to buckling stress, and takes a bistable state.

13. The method according to claim 1, wherein at least one said rigid mass is made in the form of a structure including solid strips substantially parallel to each other and separated in pairs by a slot and connected in pairs by an edge or a head, and said duration of the silicon dioxide $SiO_2$ growth phase is adjusted to fill said slot and to angularly separate at least two, consecutive said solid strips in relation to the edge thereof or to said head, by an encounter and development of oxide growths on said consecutive solid strips.

14. The method according to claim 13, wherein said component is made with an initial width of said slot, prior to silicon dioxide growth, which is comprised between 1 and 10 micrometers, and there is grown on opposite surfaces of said consecutive solid strips an oxidation having a thickness comprised between 1 and 10 micrometers and greater than half said initial width of said slot.

15. The method according to claim 13, wherein said flexible beam is prestressed by the encounter of oxide growths in a structure in accordion shape and including solid strips in an accordion or coiled shape located at an extreme edge of said flexible beam.

16. The method according to claim 1, wherein the at least one said rigid mass is made in the form of a structure including zigzag or Z solid strips connected in pairs at an edge or a head wherein a certain angle is formed between said consecutive solid strips, and said duration of silicon dioxide $SiO_2$ growth phase is adjusted to fill a slot and to angularly separate at least two said consecutive solid strips in relation to the edge thereof or to the head thereof, by an encounter and development of oxide growths on said consecutive solid strips, and said flexible beam is prestressed, by opening apex angles of said zigzag structure located at an extreme edge of said flexible beam, by silicon dioxide growth forcing the opening of said angles, the displacement being amplified by the Z or zigzag geometry of said structure.

17. The method according to claim 1, wherein said duration of the silicon dioxide $SiO_2$ growth phase is adjusted so that the cross-section of any of said beam finally includes between 10% and 100% silicon dioxide.

18. The method according to claim 1, wherein said duration of the silicon dioxide $SiO_2$ growth phase is adjusted so that the cross-section of any of said rigid mass finally includes between 0.1% and 50% silicon dioxide.

* * * * *